United States Patent [19]

Irving

[11] Patent Number: 4,518,676

[45] Date of Patent: May 21, 1985

[54] PHOTOPOLYMERIZABLE COMPOSITIONS CONTAINING DIARYLIODOSYL SALTS

[75] Inventor: Edward Irving, Burwell, England

[73] Assignee: Ciba Geigy Corporation, Ardsley, N.Y.

[21] Appl. No.: 530,800

[22] Filed: Sep. 9, 1983

[30] Foreign Application Priority Data

Sep. 18, 1982 [GB] United Kingdom ............... 8226707
Jun. 10, 1983 [GB] United Kingdom ............... 8315926

[51] Int. Cl.³ ............................................. G03C 1/68
[52] U.S. Cl. ............................ 430/280; 204/159.11; 204/159.23; 204/159.24; 430/925
[58] Field of Search .................... 430/280, 925; 204/159.11, 159.23, 159.24

[56] References Cited

U.S. PATENT DOCUMENTS

| | | |
|---|---|---|
| 4,026,705 | 5/1977 | Crivello et al. . |
| 4,090,936 | 5/1978 | Barton . |
| 4,108,747 | 8/1978 | Crivello et al. . |
| 4,190,602 | 2/1980 | Brünisholz et al. . |
| 4,193,799 | 3/1980 | Crivello . |
| 4,227,978 | 10/1980 | Barton . |
| 4,256,828 | 3/1981 | Smith . |
| 4,299,938 | 11/1981 | Green et al. ............... 204/159.11 |
| 4,308,400 | 12/1981 | Felder et al. . |
| 4,310,469 | 1/1982 | Crivello . |
| 4,319,974 | 3/1982 | Crivello ..................... 204/159.11 |
| 4,339,567 | 7/1982 | Green et al. ............... 204/159.11 |

FOREIGN PATENT DOCUMENTS

| | | |
|---|---|---|
| 1491539 | 11/1977 | United Kingdom . |
| 1495746 | 12/1977 | United Kingdom . |
| 1516351 | 7/1978 | United Kingdom . |
| 1539192 | 1/1979 | United Kingdom . |
| 2073760 | 10/1981 | United Kingdom . |

OTHER PUBLICATIONS

F. M. Beringer et al., J Org Chem, 33, 2981, (1968).

*Primary Examiner*—Jack P. Brammer
*Attorney, Agent, or Firm*—Luther A. R. Hall

[57] ABSTRACT

Photopolymerizable compositions contain a cationically polymerizable material, such as an epoxide resin, a phenoplast, or an aminoplast, and, as photoinitiator, a diaryliodosyl salt of formula

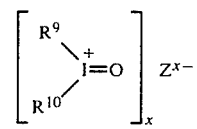

V where
$R^9$ and $R^{10}$ are the same or different and each represents a monovalent aromatic radical,
x represents 1, 2, or 3, and
$Z^{x-}$ is an anion of a protic acid.

Suitable diaryliodosyl salts of formula V include diphenyliodosyl hexafluorophosphate, hexafluoroantimonate, tetrafluoroborate, toluene-p-sulfonate, and chloride.

The compositions may be used as surface coatings and adhesives, and in the preparation of reinforced composites and printed circuits.

15 Claims, No Drawings

PHOTOPOLYMERIZABLE COMPOSITIONS CONTAINING DIARYLIODOSYL SALTS

This invention relates to compositions comprising a cationically-polymerisable material and a diaryliodosyl salt. It also relates to the polymerisation of such compositions by means of actinic radiation, and to the use of such compositions as surface coatings, in the preparation of printing plates and printed circuits, and as adhesives.

The desirability of inducing polymerisation in organic materials by means of actinic radiation is well known. Such procedures may, for example, avoid the use of toxic and/or inflammable solvents with their attendant problems of pollution and costs of recovery. Photopolymerisation enables insolubilisation of resin compositions to be restricted to defined areas, i.e., to those which have been irradiated, and so permits the production of printed circuits and printing plates or allows the bonding of substrates to be confined to required zones. Also, irradiation procedures are often more rapid than those involving heating and a consequential cooling step.

The use of aromatic iodonium salts as photopolymerisation catalysts for cationically polymerisable materials has been disclosed.

Thus, British Patent Specification No. 1,516,351 describes curable compositions comprising:

(A) a monoepoxide, an epoxide resin, or a mixture thereof polymerisable to a higher molecular weight state, and (B) a radiation-sensitive halonium salt in an amount capable of effecting the cure of (A) by release of an acid catalyst when exposed to radiant energy.

Typical such aromatic halonium salts are diphenyliodonium tetrafluoroborate, hexafluorophosphate, hexafluoroantimonate, and hexafluoroarsenate.

British Patent Specification No. 1,491,539 describes photopolymerisable compositions comprising:

(A) an organic material that is cationically polymerisable and (B) 0.5 to 30 parts, per 100 parts by weight of the organic material, of an aromatic iodonium complex salt photoinitiator of formula

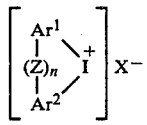

in which $Ar^1$ and $Ar^2$ represent aromatic groups having 4 to 20 carbon atoms which are phenyl, thienyl, furanyl, or pyrazolyl groups, and which may optionally be substituted or have one or more fused benzo rings, Z represents an atom of oxygen or sulphur, or a group of formula

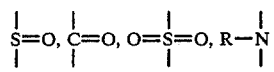

(where R represents —H, a lower alkyl group, or a carboxylic acyl group), a direct carbon-to-carbon bond, or a group of formula

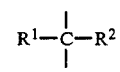

(in which $R^1$ and $R^2$ each represent —H, alkyl, or alkenyl), n is zero or 1, and $X^-$ is a tetrafluoroborate, hexafluorophosphate, hexafluoroarsenate, hexachloroantimonate, or hexafluoroantimonate anion.

Cationically polymerisable organic materials listed include oxetanes, lactones, vinyl ethers and mono- or polyepoxides, and typical iodonium complex salts again include diphenyliodonium tetrafluoroborate, hexachloroantimonate, hexafluoroantimonate, and hexafluorophosphate.

British Patent Specification No. 1,539,192 describes photopolymerisable compositions comprising at least one acid-polymerisable or acid-curable material and, as photosensitiser, at least one iodonium salt of formula

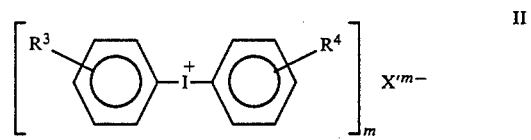

where m is 1 or 2, each of $R^3$ and $R^4$ is a hydrogen or halogen atom, a nitro group, a hydrocarbon or substituted hydrocarbon group, or a heterocyclic group, and $X'^{m-}$ is an anion derived from an acid which is capable of polymerising or curing the acid-polymerisable or acid-curable material.

Suitable acid-polymerisable or acid-curable materials include epoxides, episulphides, phenolic resins, aminoplasts, and poly(N-methylol) derivatives of polycarboxylic acid amides such as of polyacrylamide, and suitable iodonium salts include diphenyliodonium tetrafluoroborate, 4,4'-dimethyldiphenyliodonium hydrogen sulphate, and 4,4'-dichlorodiphenyliodonium hexafluoroarsenate.

Other patent specifications disclose the photopolymerisation of specific types of materials in the presence of a diaryliodonium salt.

For example, in British Patent Specification No. 1,565,671 and the corresponding U.S. Pat. No. 4,256,828 there is described a composition comprising a polyepoxide, an organic hydroxyl compound with a hydroxyl functionality of 1 or more, such as an alkylene glycol, and, as photoinitiator, a salt of formula I.

In British Patent Specification No. 1,554,389 and the corresponding U.S. Pat. No. 4,193,799 there are described photocurable compositions comprising an epoxide resin, a polyvinyl acetal, and an aromatic onium salt, which term is used to include iodonium salts such as diphenyliodonium hexafluoroarsenate.

U.S. Pat. No. 4,090,936 describes photohardenable liquid compositions comprising an epoxide compound having an average epoxide functionality of 1 to 1.3, a compatible polymer having a glass transition temperature of 20° to 105° C. and which is an acrylate or methacrylate polymer, a styrene-allyl alcohol copolymer, or polyvinyl butyral, and, as photoinitiator, an aromatic complex salt, which term is used to include the diaryliodonium salts of formula I.

Belgian Patent Application No. 880 959 describes storage-stable, UV-hardenable epoxy-silane compositions containing, as photoinitiator, a diaryliodonium salt of formula

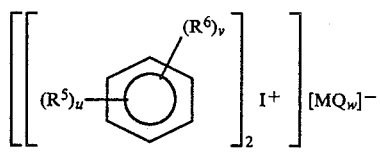

where $R^5$ is an alkyl or haloalkyl group of from 4 to 20 carbon atoms, $R^6$ is an alkyl group of from 1 to 3 carbon atoms, an alkoxy group of from 1 to 8 carbon atoms, a nitro group, or a halogen atom, M is an atom of a metal or metalloid, Q is a halogen atom, u is 1 to 4 and v is zero or 1 to 3 such that (u+v) is 1 to 4, and w is 4 to 6.

U.S. Pat. No. 4,227,978 describes photohardenable compositions comprising a halogenated oligomeric ester, such as one derived from tetrachlorophthalic anhydride and ethylene glycol, an acrylate or methacrylate monomer, such as butanediol acrylate, a cationic initiator such as diphenyliodonium hexafluorophosphate, an epoxide compound, and a free-radical initiator such as diethoxyacetophenone.

British Patent Specification No. 2,073,760 discloses radiation-curable compositions comprising a dihydropyran and, as catalyst that liberates acid on exposure to radiation, an aryliodonium, aryldiazonium, or arylsulphonium salt.

Finally, British Patent Specification No. 1,535,492, and the corresponding U.S. Pat. No. 4,108,747, disclose curable compositions consisting of a cationically polymerisable material, such as a mixture of an epoxy novolak and 4-vinylcyclohexene dioxide or diethylene glycol divinyl ether, together with a radiation-sensitive sulphonate, which term includes iodonium sulphonates of the formula

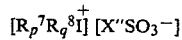

in which $R^7$ is an aromatic monovalent group, $R^8$ is an aromatic divalent group, p is zero or 2, q is zero or 1, such that one, but not both, of p and q is zero, and X'' is an aromatic hydrocarbyl group of 6 to 13 carbon atoms, an alkyl or haloalkyl group of 1 to 8 carbon atoms, or fluorine.

In an article by F. M. Beringer and P. Bodlaender, J. Org. Chem., 1968, 33, 2981-4, various diaryliodosyl salts, and their preparation, are described. This article does not, however, give any indication of the behaviour of such salts when subjected to actinic irradiation, nor of any utility for them.

Surprisingly, it has now been found that certain iodine salts in which the iodine is in a higher oxidation state, i.e., diaryliodosyl salts, will also act as photoinitiators, since they will liberate an acidic species on exposure to UV light. None of these prior art references suggests that an iodosyl salt would have this valuable property.

The iodonium salts of the prior art are also said to be heat-curing or heat-polymerising catalysts. However, the iodosyl salts of the compositions of this invention have little or no effect on heating in the absence of actinic radiation with compounds capable of being transformed into a higher-molecular weight material under the influence of a cationic catalyst. Thus, a composition comprising 2 parts by weight of diphenyliodosylhexafluorophosphate and 100 parts by weight of the most commonly employed epoxide resin, (2,2-bis(4-glycidyloxyphenyl)propane), did not gel on heating at 150° C. for 48 hours. It follows that, protected from actinic radiation, compositions of the present invention have desirably long pot-lives.

Accordingly, this invention provides photopolymerisable compositions comprising at least one cationically polymerisable material and, as photoinitiator, at least one diaryliodosyl salt of formula

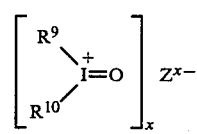

where $R^9$ and $R^{10}$, which may be the same or different, each represents a monovalent aromatic radical of from 4 to 25 carbon atoms, x represents 1, 2, or 3, and $Z^{x-}$ denotes an x-valent anion of a protic acid.

Suitable anions $Z^{x-}$ are those derived from organic carboxylic acids, such as acetates and trifluoroacetates, those derived from organic sulphonic acids Y—SO$_3$H, where Y denotes an aliphatic, aromatic or aliphatic-substituted aromatic group, preferably of 1 to 20 carbon atoms, any of which may be substituted by one or more halogen atoms, such as methanesulphonates, benzenesulphonates, toluene-p-sulphonates, and trifluoromethanesulphonates, and those derived from inorganic acids, typically halides, such as fluorides, chlorides, and bromides, halates, such as iodates, perhalates such as perchlorates, and also nitrates, sulphates, hydrogen sulphates, phosphates, hydrogen phosphates, and complex anions such as pentafluorohydroxoantimonates and those of formula MQ$_w^-$, where M represents an atom of a metal or metalloid, Q represents a halogen atom, and w is an integer of from 4 to 6 and is one more than the valency of M.

On exposing these novel compositions to radiation of suitable wavelength the photoinitiator of formula V liberates an acidic species which brings about polymerisation or crosslinking of the composition. This invention therefore further provides a process for the preparation of polymeric or crosslinked material which comprises subjecting a photopolymerisable composition comprising at least one cationically polymerisable material and a photoinitiator of formula V to radiation of wavelength such as to activate the photoinitiator and to polymerise or crosslink the composition.

Radiation used in the process of the present invention may be exclusively ultraviolet radiation or it may be radiation having wavelengths in both the ultraviolet and visible regions of the spectrum. The compositions may also contain dyes so that they are responsive to visible regions of the spectrum. Suitable dyes are disclosed in, for example, U.S. Pat. No. 4,026,705, and are usually cationic, such as acridine yellow, acridine orange, phosphine R, benzoflavin, setoflavin T, and their mixtures.

The preferred wavelength for radiation used in the process of this invention is within the range 200 to 600 nm, especially 200 to 400 nm.

In the diaryliodosyl salts of formula V the groups $R^9$ and $R^{10}$ are preferably the same and are optionally-substituted mono-, di-, or tri-homocyclic or heterocyclic aromatic groups. Examples of suitable heterocyclic aromatic groups are thienyl, furyl, pyridyl, and pyrazolyl groups. Examples of suitable tricyclic aromatic groups are anthryl, phenanthryl, and fluorenyl groups, while suitable mono- and dicyclic aromatic groups are phenyl and naphthyl groups and groups of formula

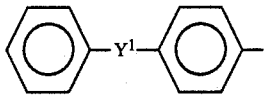

VI where $Y^1$ denotes a carbon-carbon bond, an ether oxygen atom, or a group of formula —$CH_2$— or —$C(CH_3)_2$—. Any of these aromatic groups may, if desired, be substituted by one or more atoms or groups which do not interfere with the liberation of an acid species when the diaryliodosyl salt is irradiated. Typical such substituents include alkyl and alkoxy groups of 1 to 4 carbon atoms, nitro groups, and halogen atoms. Preferably, $R^9$ and $R^{10}$ are each phenyl, optionally substituted on each of the phenyl rings by an alkyl group of 1 to 4 carbon atoms, especially a methyl or isopropyl group, a halogen atom, especially a fluorine atom or a nitro group.

Anions of formula $MQ_w$ are preferably polyhalides of antimony, arsenic, bismuth, iron, tin, boron, and phosphorus, such as hexafluoroantimonate, hexachloroantimonate, hexafluoroarsenate, pentachlorobismuthate, tetrachloroferrate, hexachlorostannate, tetrafluoroborate, or hexafluorophosphate, the two last-named being especially preferred.

Any cationically polymerisable material may be cured or polymerised by exposure to radiation in the presence of a suitable diaryliodosyl salt of formula V. However, not any such material will be cured by all such salts, the precise nature of the material and that of the anion Z is critical and must be selected to give effective curing. Matching a cationically polymerisable material with a suitable anion is well within the knowledge of those skilled in the art of curing or polymerising cationically polymerisable compositions. For example, salts containing anions derived from organic carboxylic acids, organic sulphonic acids, and inorganic acids, especially acetates, trifluoroacetates, methanesulphonates, benzenesulphonates, toluene-p-sulphonates, trifluoromethanesulphonates, fluorides, chlorides, bromides, iodates, perchlorates, nitrates, sulphates, hydrogen sulphates, phosphates or hydrogen phosphates are capable of curing phenoplasts, such as phenol-formaldehyde resins, and aminoplasts, such as urea-formaldehyde and melamine-formaldehyde resins. Salts containing a metal halogenide or metalloid halogenide anion are capable of curing epoxide resins or episulphide resins, or polymerising mono-1,2-epoxides, monoepisulphides or vinyl ethers. Other materials which may be cured or polymerised by irradiation in the presence of an iodonium salt, such as those mentioned in the patent specifications listed herein in the discussion of the prior art, may be cured or polymerised by irradiation in the presence of a suitable diaryliodosyl salt of formula V.

The cationically polymerisable material used in the present invention may be, for example, an oxetane, a thiirane, or a tetrahydrofuran. Preferably it is a 1,2-monoepoxide or episulphide having from 2 to 20 carbon atoms, such as ethylene oxide, ethylene sulphide, propylene oxide, or propylene sulphide, an epoxide resin, especially a polyglycidyl ether of a bisphenol, a phenoplast, an aminoplast such as a urea-formaldehyde or melamine-formaldehyde resin, or other methylol compound, such as a poly(N-methylol) derivative of a polycarboxylic acid amide. Ethylenically-unsaturated materials that are cationically polymerisable may also be used, such as diketene, vinyl ethers, vinylcarbazole, or styrene.

The amount of diaryliodosyl salt present in the compositions is not usually critical, since only catalytic amounts are necessary to bring about curing or photopolymerisation. Generally there will be employed from 0.01% to 10%, and preferably from 0.5 to 5%, by weight, calculated on the weight of cationically polymerisable material.

Other materials which may be incorporated in compositions of this invention include diluents, particularly liquid diluents, fillers such as silica, talc, glass microballoons, clays, powdered metals or zinc oxide, viscosity modifiers such as asbestos, and rubbers, tackifiers, and pigments.

Preferably the compositions of this invention also contain a photochemical free-radical generator or a photosensitiser. We have found that, by incorporation of suitable such accelerators, the speed of curing is further increased, thereby permitting the use of shorter exposure times and/or of less powerful sources of irradiation. The particular free radical generators preferred are aromatic carbonyl compounds. Although they have been used for free-radical polymerisation of ethylenically-unsaturated compounds it is surprising that they accelerate cationic polymerisation.

Suitable aromatic carbonyl compounds include ketals of aromatic diketones, particularly compounds of formula

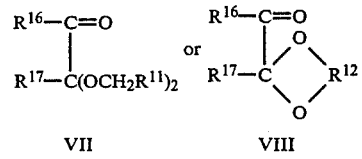

VII  VIII where $R^{11}$ represents a hydrogen atom, an alkyl group of 1 to 5 carbon atoms, an alkenyl group of 2 or 3 carbon atoms, an aralkyl group of 7 to 9 carbon atoms, an aralkenyl group of 8 or 9 carbon atoms, or a group of formula —$(CH_2)_m R^{13}$, $R^{12}$ represents a group of formula —$CH_2CH(R^{15})$— or —$CH_2CH(R^{15})CH_2$—, $R^{13}$ denotes a halogen atom or a group of formula —$OR^{14}$, —$SR^{14}$, —$OR^{18}$, —$SR^{18}$, —$OCOR^{14}$, or —$COOR^{14}$, m is 1, 2, or 3, $R^{14}$ denotes an alkyl group of 1 to 4 carbon atoms, $R^{15}$ denotes a hydrogen atom or an alkyl group of 1 to 18 carbon atoms, and $R^{16}$, $R^{17}$, and $R^{18}$ each independently represent a phenyl group which is unsubstituted or is substituted by up to 3 substituents chosen from halogen atoms, alkyl or alkoxy groups of 1 to 4 carbon atoms, and phenyl groups.

Examples of compounds of formula VII are benzil dimethyl ketal, benzil diethyl ketal, benzil di(2-methoxyethyl)ketal, and benzil di(2-chloroethyl)ketal. Examples of compounds of formula VIII are 2-phenyl-2-benzoyl-4-methyl-1,3-dioxolane and 2-phenyl-2-benzoyl-1,3-dioxane. The particularly preferred such aromatic carbonyl compound is benzil dimethyl ketal.

Compounds of formula VII or of formula VIII are described in British Patent Specification No. 1,390,006, where they are employed for the photopolymerisation and photocrosslinking of ethylenically-unsaturated compounds such as methyl acrylate, styrene-containing polyesters based on maleic acid, and diallyl phthalate prepolymers.

Other substances suitable for use as the photoaccelerator include aromatic-aliphatic ketones of one of the formulae

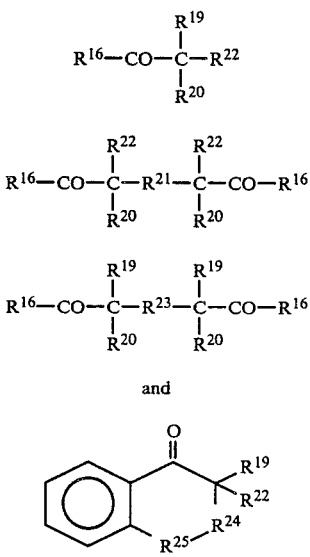

where $R^{16}$ has the meaning assigned above, $R^{19}$ and $R^{20}$ each denote a monovalent aliphatic, cycloaliphatic, or araliphatic group, or together with the attached carbon atom may denote a cycloalkylene group, $R^{21}$ represents a carbon-carbon bond or a divalent organic radical $R^{22}$ represents a hydroxyl group or an amino group, or a monovalent etherified or silylated such group, $R^{23}$ represents a divalent amino, ether, or siloxy group, $R^{24}$ represents a direct chemical bond or —$CH_2$—, and $R^{25}$ represents —O—, —S—, —$SO_2$—, —$CH_2$—, or —$C(CH_3)_2$—.

These compounds, preferred members of which include 2-allyloxy-2-methylpropiophenone, 2-benzyloxy-2-methylpropiophenone, 2-hydroxy-2-methyl-p-phenoxypropiophenone, 1-benzoylcyclohexanol, 1-benzoylcyclopentanol, and bis(4-(α-hydroxyisobutyryl)-phenyl)ether, are likewise described as photopolymerisation catalysts for ethylenically-unsaturated compounds and as photocrosslinkers for polyolefins in European Patent Application No. 0 003 002.

Other compounds which may be used to enhance the photopolymerising rate of the salts of formula V are 2-substituted thioxanthones of formula

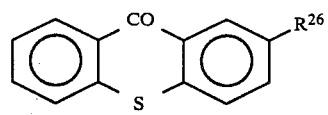 XIII where $R^{26}$ denotes either a chlorine atom or an alkyl group of 1 to 6 carbon atoms such as an isopropyl or tert.butyl group. Compounds of formula XIII, especially the 2-chlor compound, are used commercially as photopolymerisation catalysts for ethylenically-unsaturated compounds and as photocrosslinkers for polyolefins.

We prefer to include from 30% to 125%, and especially from 50% to 100%, by weight of the photoaccelerator, calculated on the weight of the diaryliodosyl salt of formula V.

The compositions may also contain photosensitisers such as polyarylenes (e.g., perylene and 9,10-diethoxyanthracene), polyarylpolyenes, 2,5-diarylisobenzofurans, 2,5-diarylfurans, 2,5-diarylthiofurans, 2,5-diarylpyrroles, 2,5-diarylcyclopentadienes, polyarylphenylenes, coumarin, and polyaryl-2-pyrazolines.

Diaryliodosyl salts of formula V may be prepared by a method similar to that described by F. M. Beringer and P. Bodlaender, loc. cit. An iodoarene of formula XIV is oxidised to the corresponding iodoxyarene of formula XV, using peracetic acid. Treatment of the iodoxyarene, or a mixture of two iodoxyarenes, with an alkali metal hydroxide gives the iodosyl hydroxide of formula XVI, which may be converted into the carbonate of formula XVII by treatment with carbon dioxide. This hydroxide or carbonate is treated with an acid of formula $H_xZ$ (where such acids exist) to form the desired salt. (Direct neutralisation of the iodosyl hydroxide sometimes leads to lower yields of the desired salt than if it is first converted into the carbonate.) Where such acids do not exist in the free state, or are difficult to handle, the hydroxide or carbonate may be treated e.g., with acetic acid or trifluoroacetic acid to form the corresponding acetate of formula XVIII or trifluoroacetate of formula XIX. Such a salt is treated with an alkali metal or ammonium salt of the acid $H_xZ$, e.g., a phosphate, hexafluorophosphate, tetrachloroferrate or hexafluoroantimonate to give the desired product of formula V by double decomposition.

These reactions are shown in the following scheme:

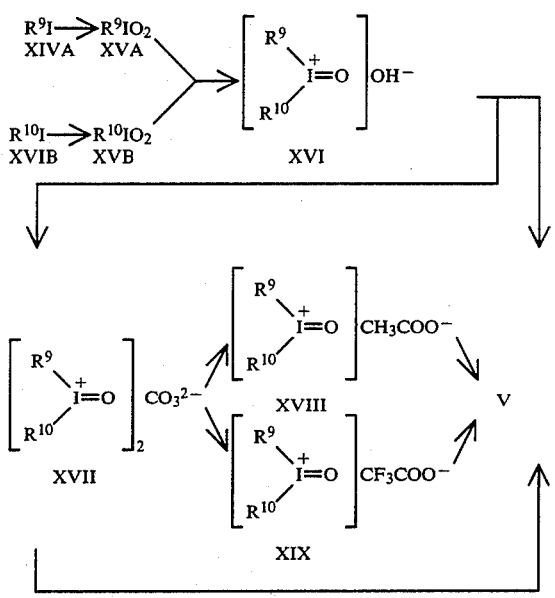

Hexafluoroantimonates may be made by addition of solid sodium or potassium hexafluoroantimonate to an aqueous solution of the iodosyl acetate or trifluoroacetate: if the sodium or potassium salt is first dissolved in water, then, due to hydrolysis, the product isolated is the hydroxopentafluoroantimonate ($Z^{x-} = SbF_5(OH)^-$).

If desired, the compositions of this invention may be partially cured by irradiation and the curing completed by heating. For such a two-stage curing process it is necessary that the composition contains a heat-activated curing agent for the curable material. Such heat-activated curing agents are known and it is within the routine skill of those familiar with curing processes to select a heat-curing agent that is suitable for the particular curable material. In these circumstances it is, of course, important that irradiation is carried out at a temperature below that at which substantial heat-curing of the photopolymerised product by means of that heat-curing agent would occur.

The compositions of this invention may be used as surface coatings. They may be applied to a substrate such as steel, aluminium, copper, cadmium, zinc, paper, or wood, preferably as a liquid, and irradiated or heated. By photopolymerising part of the coating, as by irradiation through a mask, those sections which have not been exposed may be washed with a solvent to remove the unpolymerised portions while leaving the photopolymerised, insoluble portions in place. Thus the compositions of this invention may be used in the production of printing plates and printed circuits. Methods of producing printing plates and printed circuits from photopolymerisable compositions are well known (see, e.g., our British Patent Specification No. 1,495,746).

The compositions may also be used as adhesives. A layer of the composition may be sandwiched between two surfaces of objects, then the assembly is irradiated and, if desired, heated to complete the polymerisation. It is, of course, necessary that at least one of the objects be transparent to the actinic radiation, e.g., of glass.

The compositions are also useful in the production of fibre-reinforced composites, including sheet moulding compounds.

They may be applied directly, continuously or batchwise, in liquid form, to reinforcing fibres (including strands, filaments, and whiskers), which may be in the form of woven or nonwoven cloth, unidirectional lengths, or chopped strands, especially glass, boron, stainless steel, tungsten, alumina, silicon carbide, asbestos, potassium titanate whiskers, an aromatic polyamine such as poly(m-phenylene isophthalamide), poly(p-phenylene terephthalamide), or poly(p-benzamide), polyethylene, polypropylene, or carbon.

The fibre-reinforced composite may also be made from films of the photopolymerised composition, by a batch process or continuously. In the batch process the fibrous reinforcing material is laid on a film of the photopolymerized composition which is advantageously under slight tension, when a second such film may, if desired, be laid on top, and then the assembly is pressed while being heated. It may also be made continuously, such as by contacting the fibrous reinforcing material with a film of the photopolymerised composition, then, if desired, placing a second such film on the reverse face of the fibrous reinforcing material and applying heat and pressure. More conveniently, two such films, preferably supported on the reverse side by belts or strippable sheets, are applied simultaneously to the fibrous reinforcing material so as to contact each exposed face. When two such films are applied, they may be the same or different.

Multilayer composites may be made by heating under pressure interleaved films and layers of one or more fibrous reinforcing materials. When unidirectional fibres are used as the reinforcement material, successive layers of them may be oriented to form cross-ply structures.

With the fibrous reinforcing material there may be used additional types of reinforcement such as a foil of metal (e.g., aluminium, steel, or titanium) or a sheet of a plastics material (e.g., an aromatic or aliphatic polyamide, a polyimide, a polysulphone, or a polycarbonate) or of a rubber (e.g., a neoprene or acrylonitrile rubber).

In the production of sheet moulding compounds, a composition of this invention, together with the chopped strand reinforcing material and any other components, is exposed to irradiation in layers through supporting sheets.

The polymerisable composition is preferably applied so that the composite contains a total of from 20 to 80% by weight of the said composition and, correspondingly, 80 to 20% by weight of the reinforcement. More preferably, a total of 30 to 50% by weight of the composition is employed.

The compositions of this invention are useful in the production of putties and fillers. They may be used as dip-coatings, an article to be coated being dipped in the liquid composition, withdrawn, and the adhering coating being irradiated to photopolymerise (and hence solidify it) and subsequently, if desired, being heated.

We have found that it is possible, using diaryliodosyl salts of formula V, to cure epoxide resins and phenoplasts in two stages; the resin is first converted into the partially cured B-stage by exposing it to actinic radiation in the presence of a said diaryliodosyl salt and a latent, heat-activated crosslinking agent for the epoxide resin or phenoplast, and, in a second stage, the partially cured composition is heated so that curing is completed by means of the heat-activated crosslinking agent. Thus, a liquid or semiliquid composition may be prepared, which may then be shaped or used to impregnate a substrate while being irradiated to solidify it; then the solidified body is heated when desired, to complete the cure of the resin.

According, therefore, to another embodiment of this invention, an epoxide resin or a phenoplast is irradiated in the presence of an amount of diaryliodosyl salt of formula V effective for the polymerisation of the epoxide resin or phenoplast and of a curing amount of a latent heat-curing agent for the epoxide resin or phenoplast to form a B-stage product, and, when desired, curing of the composition is completed by heating it.

A further embodiment comprises a composition containing an epoxide resin or a phenoplast, an amount of a diaryliodosyl salt of formula V effective for polymerisation of the said epoxide resin or phenoplast on exposure of the composition to actinic radiation, and a curing amount of a latent heat-curing agent for the epoxide resin or phenoplast.

Suitable heat-activated crosslinking agents for the epoxide resin compositions include polycarboxylic acid anhydrides, complexes of amines, especially primary or tertiary aliphatic amines such as ethylamine, trimethylamine, and n-octyldimethylamine, with boron trifluoride or boron trichloride, and latent boron difluoride chelates. Aromatic polyamines and imidazoles are usually not preferred, because indifferent results are obtained, possibly due to reaction between the acid catalyst liberated and the amine. Dicyandiamide can be used successfully, providing it is in relatively coarse particles.

Suitable heat-activated crosslinking agents for novolacs include hexamethylenetetramine and paraform.

The temperature and duration of heating required for the thermal curing after photopolymerisation, and the proportions of heat-activated curing agent, are readily found by routine experimentation and easily derivable from what is already well known concerning the heat-curing of epoxide resins and phenol-aldehyde novolacs.

Compositions containing resins having epoxide groups or phenolic hydroxyl groups through which they can be heat-cured after photopolymerisation are particularly useful in the production of multilayer printed circuits.

Conventionally, a multilayer printed circuit is prepared from several double-sided printed circuit boards of copper, stacked one on top of another and separated from each other by insulating sheets, usually of glass fibre impregnated with an epoxide resin or a phenol-formaldehyde resin in the B-stage. If a heat-curing agent is not admixed with the layer of photopolymerisable resin in the circuit board, it can be incorporated in the insulating layers which alternate with the plates, these layers conventionally being of an epoxide resin or phenol-formaldehyde resin prepreg; sufficient of the heat-curing agent contained in the prepreg, providing the latter is not too thick, migrates to induce crosslinking of the photopolymerised epoxide resin or phenol-formaldehyde resin. The stack is heated and compressed to bond the layers together. Conventional photopolymerisable materials, however, do not form strong bonds either with copper or with resin-impregnated glass fibre sheets. A stack which is bonded with the photopolymer still covering the copper is therefore inherently weak and in use can become delaminated. It is therefore normal practice to remove the residual photopolymer after the etching stage, either by means of powerful solvents or by a mechanical method, e.g., by means of brushes. Such a stripping process can damage the copper of the printed circuit or the surface of the laminate on which the circuit rests, and so there is a need for a method which would avoid the necessity of removing the photopolymerised material prior to bonding the board together. The presence of residual crosslinking groups in the compositions of this invention means that crosslinking can occur when the boards are bonded, resulting in good adhesion to the copper and to the resin-impregnated glass fibre substrate, so avoiding the necessity just referred to; also, products with a higher glass transition temperature are obtained.

Another application involving heat-curing after photopolymerisation of the compositions of this invention is in filament winding. Thus, a continuous tow of fibrous reinforcement is impregnated with a composition containing a latent heat-curing agent and then wound around a mandrel or former while exposing the winding to actinic radiation. Such filament windings still have a degree of flexibility, permitting the mandrel or former to be removed more readily than when a rigid winding is formed in one step. When required, the winding is heated to crosslink the composition.

In a further such application, a layer of the composition in liquid form is irradiated until it solidifies, producing a film adhesive, which is then placed between, and in contact with, two surfaces which are to be bonded together, and the assembly is heated to complete crosslinking of the composition. The film may be provided on one face with a strippable backing sheet, e.g., of a polyolefin or a polyester, or of cellulosic paper having a coating of a silicone release agent. Manipulation of the assembly is often easier if the film has a tacky surface. This may be produced by coating the film with a substance which is tacky at room temperature but which crosslinks to a hard, insoluble, infusible resin under the conditions of heat employed to complete crosslinking of the composition. However, an adequate degree of tackiness often exists without additional treatment, especially if polymerisation of the composition has not proceeded too far. Suitable adherends include metals such as iron, zinc, copper, nickel, and aluminium, ceramics, glass, and rubbers.

The following Examples illustrate the invention.

Iodosyl salts are prepared as follows:

Iodoxybenzene (4.72 g) is added to 1-Normal aqueous sodium hydroxide solution (40 ml) at 0° C. and stirred vigorously. After 2 hours the precipitated sodium iodate is removed by filtration and carbon dioxide is bubbled through the filtrate until the solution is neutral. 1-Normal acetic acid solution is added slowly to liberate carbon dioxide, a slight excess being added. Diphenyliodosyl acetate monohydrate is filtered off as a white solid, m.pt. 105°–110° C. (decomp.), 2.76 g being obtained.

This monohydrate (1.87 g) is dissolved in boiling water (25 ml). The solution is treated with decolourising charcoal and filtered hot. A saturated aqueous solution of potassium hexafluorophosphate is added slowly until addition causes no further precipitation. The mixture is then cooled and filtered. The residue is dried over phosphorus pentoxide in vacuo at room temperature to give diphenyliodosyl hexafluorophosphate (0.87 g), m.pt. 120°–130° C. (decomp.).

Iodoxybenzene (35.4 g) is added to 1-Normal sodium hydroxide (300 ml) at 0° C. and stirred vigorously. After 2 hours the mixture is filtered and carbon dioxide is bubbled through the filtrate until the solution is neutral. A portion of this carbonate solution (100 ml) is treated slowly with fluoroboric acid (40%) until evolution of carbon dioxide ceases. A further quantity of the acid (2 ml) is then added and the precipitate is filtered off. This precipitate is washed with ice-cold water and dried to give diphenyliodosyl tetrafluoroborate (2.4 g) melting in the range 110°-120° C. (decomp.).

Diphenyliodosyl trifluoroacetate is prepared as described by F. M. Beringer and P. Bodlaender, loc. cit.

Bis-(4-methylphenyl)iodosyl trifluoroacetate (1.16 g; prepared as described by F. M. Beringer and P. Bodlaender, loc. cit.) is dissolved in boiling water (10 ml), filtered, and the filtrate is treated with potassium hexafluorophosphate (0.49 g) as a saturated aqueous solution. The mixture is evaporated to about half its volume, and the precipitate is filtered off. The precipitate is then dried to give bis(4-methylphenyl)iodosyl hexafluorophosphate (0.68 g), melting at 125° C. (decomp.).

In a similar manner, but starting from bis(4-fluorophenyl)iodosyl trifluoroacetate (itself prepared according to F. M. Beringer and P. Bodlaender, loc. cit.) there is obtained bis(4-fluorophenyl)iodosyl hexafluorophosphate, mpt. 126° C. (decomposition).

In a similar manner, but starting from bis(4-isopropylphenyl)iodosyl trifluoroacetate (itself prepared by a similar metho to that described by F. M. Beringer and P. Bodlaender, loc. cit.) there is obtained bis(4-isopropylphenyl)iodosyl hexafluorophosphate, m.pt. 84° C.

Diphenyliodosyl trifluoroacetate (1.2 g) is dissolved in hot water, treated with charcoal, and filtered hot. The filtrate is treated with an aqueous solution of ammonium tetrachloroferrate (0.7 g), forming a white precipitate. This is filtered off and dried to give diphenyliodosyl tetrachloroferrate, mpt. 164° C.

Iodoxybenzene (11.8 g) is added to a stirred 1 molar solution of sodium hydroxide at 0° C. After two hours the mixture is filtered and the filtrate is treated with carbon dioxide at 0° C. until it becomes neutral. An aqueous solution of 4-toluenesulphonic acid is added with vigorous stirring until complete liberation of carbon dioxide is achieved. The solid which forms is collected by filtration, washed with ice-cold water and dried in vacuo over phosphorus pentoxide to give diphenyliodosyl 4-toluenesulphonate, mpt. 108°-110° C.

Bis(4-methylphenyl)iodosyl trifluoroacetate (F. M. Beringer and P. Bodlaender, loc. cit.) (1 g) is dissolved in boiling water (25 ml), treated with charcoal and filtered hot. The filtrate is treated with a saturated solution of sodium chloride and cooled, depositing crystals of bis(4-methylphenyl)iodosyl chloride. The crystals are filtered off and dried in air to give 0.35 g of the chloride, mpt. 146° C.

Iodoxybenzene (11.8 g) is added to a stirred 1 molar solution of sodium hydroxide (100 ml) at 0° C. Stirring is continued for 1½ hours at this temperature. The mixture is then filtered to remove precipitated sodium iodate. The filtrate is treated with a 10% solution of orthophosphoric acid to pH 5. Crystallisation is effected by cooling the solution to 0° C. overnight. The crystals are collected by filtration and air dried to afford diphenyliodosyl orthophosphate (2.5 g) m.pt. 115°-116° C. (dec.).

Diphenyliodosyl sulphate is prepared as described above for the orthophosphate except that a 10% solution of sulphuric acid is used in place of orthophosphoric acid. A yellow precipitate forms on addition of the acid. This is filtered and the solid collected. The yellowish solid is diphenyliodosyl sulphate (2.0 g) m.pt. 126°-128° C. (dec.).

Diphenyliodosyl trifluoroacetate (1.23 g) is dissolved in 30 ml of hot water. Sodium hexafluoroantimonate (0.78 g) is added and the resulting solution is cooled to 0° C. overnight. The white crystalline solid which forms is collected by filtration to afford 0.5 g of diphenyliodosyl hexafluoroantimonate m.pt. 142°-144° C. (decomposition).

3-Nitroiodoxybenzene (11.25 g), m.pt. 206° C. (decomposition), prepared in 75% yield by oxidation of 3-nitroiodobenzene using peracetic acid, is added to a stirred solution (80 ml) of 1 molar sodium hydroxide at 0° C. After 90 minutes the mixture is filtered to remove the precipitated sodium iodate. Hexafluorophosphoric acid solution (10%) is added to the filtrate. As the pH becomes lower the iodosyl salt precipitates out of solution. The addition of acid is terminated when the pH reaches about 5. The precipitate is collected by filtration and dried in air. This is bis(3-nitrophenyl)iodosyl hexafluorophosphate, (0.2 g), melting point 182° C. (decomposition).

The resins used in the Examples are as follows:

"Resin I" denotes the diglycidyl ether of 2,2-bis(4-hydroxyphenyl)propane.

"Resin II" denotes 3,4-epoxycyclohexylmethyl 3,4-epoxycyclohexane-carboxylate.

"Resin III" denotes diglycidyl 1,2-cyclohexanedicarboxylate.

"Resin IV" denotes diglycidyl 1,2-cyclohex-4-enedicarboxylate.

"Resin V" denotes 3,4-dihydro-2H-pyran-2-ylmethyl 3,4-dihydro-2H-pyran-2-carboxylate.

"Resin VI" denotes hexamethoxymethylmelamine.

"Resin VII" denotes a resol made from phenol and formaldehyde, having a phenol:formaldehyde molar ratio of 1:1.43, a viscosity at 25° C. of 0.35 Pa s, and having a solids content of 70%.

"Resin VIII" denotes a urea-formaldehyde resin having a molar ratio of formaldehyde to urea of 1.87:1.

"Resin IX" denotes Resin I that has been advanced with a bromine-containing phenol to a softening point of 50° C. and having an epoxide content of 2.0 equiv./kg.

"Resin X" denotes the tetraglycidyl ether of 1,1,2,2-tetrakis(4-hydroxyphenyl)ethane, having an epoxide content of 5.2 equiv./kg.

"Resin XI" denotes 1,4-butanediol diglycidyl ether, having an epoxide content of 9.4 equiv./kg.

"Resin XII" denotes a resol made from phenol and formaldehyde having a phenol:formaldehyde molar ratio of 1:1.14, a viscosity at 25° C. of 0.7 Pa s, and having a solids content of 76%, neutralised with 4-toluenesulphonic acid.

"Resin XIII" denotes a glycidylated novolak prepared from 2,2-bis(4-hydroxyphenyl)propane and formaldehyde, having a softening point of 72° C. and an epoxide content of 4.9 equiv./kg.

EXAMPLE 1

The resin (10 g) is mixed with diphenyliodosyl hexafluorophosphate (0.3 g) and acetone (0.15 ml) and spread onto tinplate as a coating 10 μm in thickness. The coating is irradiated using a 80 w/cm medium pressure mercury arc lamp at a distance of 20 cm. The resins used, the irradiation times, and the properties of the irradiated coatings, are given in the following Table:

TABLE 1

| Resin | Irradiation time (secs) | Irradiated coating |
|---|---|---|
| I | 1 | hard, tack-free |
| II | 1 | hard, tack-free |
| V | 4 | hard, tack-free |

EXAMPLE 2

The method of Example 1 is repeated, using bis(4-methylphenyl)iodosyl hexafluorophosphate (0.2 g), Resin IV (5.02 g), and acetone (0.15 ml). The resultant coating is tack-free after 20 seconds' irradiation.

When benzil dimethyl ketal (0.123 g) is also incorporated into the composition, it becomes tack-free after only 8 seconds' irradiation.

EXAMPLE 3

The method of Example 1 is repeated, using Resin I (10 g) and diphenyliodosyl tetrafluoroborate (0.3 g). The coating is tack-free after 30 seconds' irradiation.

When 2-chlorothioxanthone (0.15 g) is incorporated into the composition it becomes tack-free after only 10 seconds' irradiation.

EXAMPLE 4

The method of Example 1 is repeated, using Resin III (5 g) and bis(4-methylphenyl)iodosyl hexafluorophosphate (0.15 g). The coating becomes tack-free after 10 seconds' irradiation. When benzil dimethyl ketal (0.15 g) is incorporated into the composition, the coating becomes tack-free after only 6 seconds' irradiation.

EXAMPLE 5

The method of Example 1 is repeated, using diphenyliodosyl acetate or trifluoroacetate (0.15 g) and various resins (5 g). Details are given in the following Table.

TABLE 2

| Resin | Diphenyliodosyl salt | Irradiation time |
|---|---|---|
| VI | trifluoroacetate | 5 secs. |
| VII | trifluoroacetate | 12 secs. |
| VIII | acetate | 6 secs. |

The phenolic and urea-formaldehyde resins, i.e. Resins VII and VIII respectively, become tack-free as soon as the irradiation period is completed. Resin VI, being a melamine resin, requires to be heated in order to effect cure with an acidic species. It is therefore heated at 120° C. for 15 minutes after the irradiation and becomes tack-free.

EXAMPLE 6

A solution is prepared containing Resin IX (5 g), Resin X (4 g), Resin I (1 g), and diphenyliodosyl hexafluorophosphate (0.2 g) in cyclohexanone (10 g). A copper-clad laminate is coated with this composition, and the solvent evaporated, leaving a coating 5 μm thick. The coating is irradiated for 6 minutes through a negative using a 500 w medium pressure mercury lamp at a distance of 22 cm. A sharp, glossy, relief image is obtained after development in 1,1,1-trichloroethane. The uncoated copper areas are removed by treatment with an aqueous solution of iron (III) chloride (40% FeCl$_3$ by weight), the coated areas remaining intact.

EXAMPLE 7

A solution as described in Example 6 is treated with 2-chlorothioxanthone (0.05 g) and applied to a copper-clad laminate. After evaporation of the solvent a layer 8 μm thick is left on the surface of the copper. This layer is irradiated through a negative for 10 seconds, using a 5000 w metal halide lamp at a distance of 75 cm. Development in 1,1,1-trichloroethane gives a well-defined, glossy image.

EXAMPLE 8

The method of Example 1 is repeated, using bis(4-isopropylphenyl)iodosyl hexafluorophosphate (0.03 g), Resin I (1.0 g), and γ-butyrolactone (0.03 g). The coating which is obtained becomes tack-free after 1 seconds' irradiation.

EXAMPLE 9

A mixture of Resin II (50 g), Resin XI (50 g), bis(4-(fluorophenyl)iodosyl hexafluorophosphate (0.3 g), and acetone (0.3 g) are spread onto tinplate as a coating 8 μm thick. The coating is irradiated using an 80 w/cm medium pressure mercury arc lamp at a distance of 20 cm, giving a tack-free coating after 5 seconds.

EXAMPLE 10

Resin XII (100 g) and diphenyliodosyl tetrachloroferrate (3 g) are mixed and coated onto tinplate to give a coating 6–8 μm thick. The coating is irradiated using an 80 w/cm medium pressure mercury arc lamp at a distance of 20 cm, giving a tack-free film after 7 seconds.

EXAMPLE 11

Example 10 is repeated, replacing the tetrachloroferrate by an equal weight of diphenyliodosyl 4-toluenesulphonate. A tack free film is obtained after 8 seconds.

EXAMPLE 12

Example 10 is repeated, replacing the tetrachloroferrate by an equal weight of bis(4-methylphenyl)iodosyl chloride. A tack-free film is obtained after 5 seconds.

EXAMPLE 13

Resin XIII (97 g) and diphenyliodosyl hexafluorophosphate (3 g) are ground and passed through a sieve having a mesh size of 210 μm. The resulting powder is sprayed onto a charged copper-clad laminate and this laminate is heated at 100° C. for 3 minutes, which melts the powder coating leaving a layer approximately 50 μm thick. The layer is then irradiated through a negative for 3 minutes using a 5000 w metal halide lamp at a distance of 75 cm. Development with 1,1,1-trichloroethane gives a good, sharp image.

EXAMPLE 14

A mixture of Resin XII (100 g) and diphenyliodosyl phosphate (3 g) is coated onto tinplate to a thickness of 4–6 μm. Irradiation of the coating using a 80 w/cm medium pressure lamp at a distance of 20 cm gives a tack-free coating after 30 seconds.

EXAMPLE 15

A mixture of Resin XII (100 g) and diphenyliodosyl sulphate (3 g) is coated onto tinplate so that a layer 6 μm thick is obtained. Irradiation in the same manner as Example 14 for 35 seconds produces a tack-free coating.

EXAMPLE 16

A mixture of Resin I (100 parts by weight), acetone (3 parts by weight) and bis(3-nitrophenyl)iodosyl hexafluorophosphate (3 parts by weight) is coated onto tinplate to a thickness of 6–8 μm. Irradiation for 10 seconds using a 80 w/cm medium pressure mercury lamp at a distance of 20 cm produces a tack free coating.

EXAMPLE 17

The method of Example 1 is repeated, using Resin I (10 g), diphenyliodosyl hexafluoroantimonate (0.3 g) and acetone (0.15 ml). A tack-free surface is obtained after 12 seconds' irradiation.

What is claimed is:

1. A photopolymerizable composition consisting essentially of
   (a) a cationically polymerizable material, and
   (b) as photoinitiator, 0.01 to 10% by weight, based on component (a), of a diaryliodosyl salt of the formula

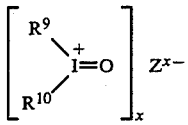

where
R$^9$ and R$^{10}$, which may be the same or different, each represent a monovalent aromatic radical of from 4 to 25 carbon atoms,
x represents 1, 2, or 3, and
Z$^{x-}$ denotes an x-valent anion of a protic acid.

2. A composition according to claim 1 in which the groups R$^9$ and R$^{10}$ are substituted thienyl, furyl, pyridyl, pyrazolyl, anthryl, phenanthryl, fluorenyl, phenyl or naphthyl groups, or groups of the formula

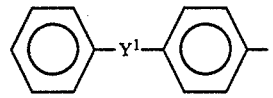

where Y$^1$ denotes a carbon-carbon bond, an ether oxygen atom or a group of formula —CH$_2$— or —C(CH$_3$)$_2$—, the substituents being alkyl or alkoxy groups of 1 to 4 carbon atoms, nitro groups, or halogen atoms.

3. A composition according to claim 1, in which the groups R$^9$ and R$^{10}$ are the same.

4. A composition according to claim 1, in which the groups R$^9$ and R$^{10}$ are thienyl, furyl, pyridyl, pyrazolyl, anthryl, phenanthryl, fluorenyl, phenyl, or naphthyl groups, or groups of formula

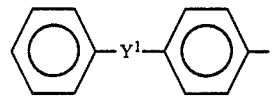

VI where Y$^1$ denotes a carbon-carbon bond, an ether oxygen atom or a group of formula —CH$_2$— or —C(CH$_3$)$_2$—.

5. A composition according to claim 1, in which the anion Z$^{x-}$ is derived from an organic carboxylic acid, an organic sulfonic acid Y—SO$_3$H, where Y denotes an aliphatic, aromatic or aliphatic-substituted aromatic group, any of which may be substituted by one or more halogen atoms, or an inorganic acid.

6. A composition according to claim 5, in which the anion Z$^{x-}$ is an acetate, trifluoroacetate, methanesulfonate, benzenesulfonate, toluene-p-sulfonate, trifluoromethanesulfonate, fluoride, chloride, bromide, iodate, perchlorate, nitrate, sulfate, hydrogen sulfate, phosphate, or hydrogen phosphate.

7. A composition according to claim 5, in which the anion Z$^{x-}$ is a pentafluorohydroxoantimonate or is an anion of formula MQ$_w^-$ where
M represents an atom of a metal or metalloid,
Q represents a halogen atom, and
w is an integer of from 4 to 6 and is one more than the valency of M.

8. A composition according to claim 7, in which the anion Z$^{x-}$ is a polyhalide of antimony, arsenic, bismuth, iron, tin, boron, or phosphorus.

9. A composition according to claim 8, in which the anion Z$^{x-}$ is a hexafluoroantimonate, hexachloroantimonate, hexafluoroarsenate, pentachlorobismuthate, tetrachloroferrate, hexachlorostannate, tetrafluoroborate, or hexafluorophosphate.

10. A composition according to claim 1, in which the cationically polymerizable material is a 1,2-monoepoxide or an episulfide having from 2 to 20 carbon atoms, an epoxide resin, a phenoplast, an aminoplast, a poly(N-methylol) derivative of a polycarboxylic acid amide, a diketone, a vinyl ether, a vinylcarbazole, or a styrene.

11. A composition according to claim 10, in which the cationically polymerizable material is a 1,2-monoepoxide or an epoxide resin and the diaryliodosyl salt has a metal halogenide or metalloid halogenide anion.

12. A composition according to claim 10, in which the cationically polymerizable material is an aminoplast or a phenoplast and the diaryliodosyl salt is an acetate, trifluoroacetate, methanesulfonate, benzenesulfonate, toluene-p-sulfonate, trifluoromethanesulfonate, fluoride, chloride, bromide, iodate, perchlorate, nitrate, sulfate, hydrogen sulfate, phosphate, or hydrogen phosphate.

13. A composition according to claim 10, in which the cationically polymerizable material is an epoxide resin or a phenoplast and the composition also contains a curing amount of a latent heat-curing agent for the epoxide resin or phenoplast.

14. A composition according to claim 1, which also contains a dye so that the composition is more responsive to visible regions of the spectrum.

15. A composition according to claim 1, which also contains a photochemical free-radical generator or a photosensitizer.

* * * * *